United States Patent [19]

Kolm et al.

[11] 4,456,394
[45] Jun. 26, 1984

[54] PIEZOELECTRIC PRINTER AND ASYMMETRIC PIEZOELECTRIC ACTUATOR USED THEREIN

[75] Inventors: Henry H. Kolm, Wayland; Eric A. Kolm, Brookline, both of Mass.

[73] Assignee: Piezo Electric Products, Inc., Cambridge, Mass.

[21] Appl. No.: 364,197

[22] Filed: Mar. 31, 1982

Related U.S. Application Data

[63] Continuation-in-part of Ser. No. 300,025, Sep. 8, 1981, Pat. No. 4,362,407.

[51] Int. Cl.³ .................. B41J 3/12; H01L 41/08
[52] U.S. Cl. .................. 400/124; 310/331; 310/332; 310/357; 310/367
[58] Field of Search .................. 400/124; 101/93.05; 310/312, 328, 330–332, 357–359, 365, 367

[56] References Cited

U.S. PATENT DOCUMENTS

| | | | |
|---|---|---|---|
| 3,500,451 | 3/1970 | Yando | 310/332 |
| 3,949,247 | 4/1976 | Fenner et al. | 310/330 X |
| 3,973,661 | 8/1976 | De Boo | 400/124 |
| 4,087,716 | 5/1978 | Heywang | 310/332 |
| 4,176,976 | 12/1979 | Lendl | 400/124 |
| 4,193,703 | 3/1980 | Sakmann | 400/124 |
| 4,196,665 | 4/1980 | Rogers et al. | 400/124 X |
| 4,218,150 | 8/1980 | Swaim | 400/124 |
| 4,237,399 | 12/1980 | Sakamoto | 310/332 X |
| 4,245,172 | 1/1981 | Shirley | 310/332 |
| 4,356,424 | 10/1982 | Marcus | 310/357 X |

FOREIGN PATENT DOCUMENTS

| | | | |
|---|---|---|---|
| 254343 | 3/1963 | Australia | 310/332 |
| 1808680 | 7/1970 | Fed. Rep. of Germany | 310/332 |

OTHER PUBLICATIONS

"Constant-Force Electroerosion Print Stylus" IBM Tech. Disclosure Bulletin, vol. 24, No. 2, 7/81, pp. 1110–1111.
"Piezoelectric Ceramic Transducers" Electron Design, Sep. 1976, pp. 78–82.

*Primary Examiner*—E. H. Eickholt
*Attorney, Agent, or Firm*—Joseph S. Iandiorio

[57] ABSTRACT

A piezoelectric printer including: a frame; a plurality of printer units mounted on the frame; each unit including an asymmetric piezoelectric bender including one or more piezoelectric members and having a mounting portion and an actuating portion, the actuating portion being moveable in an actuating direction; the bender being tapered in its lateral dimension and being larger at the mounting portion and smaller at the actuating portion; first and second metal reinforcing layers externally mounted on said bender, the first on the side of the actuating direction, the second on the opposite side; and a printing element driven by the actuating portion; means for applying an actuating voltage to the bender in the poling direction for actuating the bender to drive the printing element to the printing position and guide means attached to the frame for guiding the printing elements; the printer units are arranged in sets of stacked arrays, which may be overlapped and may include holes in each of the inferior printer units for receiving printer elements from superior printing units.

26 Claims, 10 Drawing Figures

PIEZOELECTRIC PRINTER AND ASYMMETRIC PIEZOELECTRIC ACTUATOR USED THEREIN

RELATED CASE

This is a continuation-in-part of Ser. No. 300,025, filed Sept. 8, 1981, now U.S. Pat. No. 4,362,407 "Piezoelectric Printer and Piezoelectric Multilam Actuator Used Therein", Kolm et al.

FIELD OF INVENTION

This invention relates to a piezoelectric printer, and to an asymmetric piezoelectric bender actuator which combined with a printing element provides a printer unit for constructing a dot matrix printer.

BACKGROUND OF INVENTION

Dot matrix printers use a printing head which includes a vertical row of seven to eleven fine wires guided by holes drilled in a block and driven selectively to strike a film or cloth ribbon as the printing head moves across a piece of paper. Individual characters are formed by selectively printing a matrix of dots using the fine wires or printing elements. The matrix is typically from seven dots wide by seven dots high, up to seven dots wide by eleven dots high. The more dots used, the better will be the quality of the characters that are printed. This type of printer is in common use to produce printouts of computers and word processors where the speed of conventional type printers is inadequate. This type of printer is substantially faster than type printers, but not so fast as line printers which can print entire lines of type simultaneously.

Conventional dot matrix printers may be operated magnetically using a magnetic relay in which a coil or solenoid moves an armature that drives one of the printing wires or elements. One such relay is required for each of the seven to eleven wires; the relays may be arranged in a circle around the block which guides the wires to the print wires. The relay devices are made as small as possible to permit operation at high speed, and also to minimize obstruction of the operator's view of the paper being printed. However, such magnetic drivers are not very energy efficient because of the resistance heating in the coils, and the efficiency decreases as the coils are made smaller. Thus the heating problem limits the speed of operation of the driver relays or solenoids of the matrix printers, although they do reach a speed of over 200 characters per second.

Another form of magnetically operated dot matrix printer uses a spring to drive each printer wire or element toward the paper. Each printer wire is retained in a cocked position by a permanent magnet acting against an iron head attached to each of the print wires. The print wire is released by the energization of a solenoid which provides an opposing field to that of the retaining permanent magnet. Energy is stored in the spring by the permanent magnet prior to the printing release. These types of stored-energy printers tend to be more expensive and are still not significantly faster than the armature-driven printers. Piezoelectric devices are inherently more energy efficient and involve less moving mass than magnetic devices, but attempts to design a piezoelectric printing head have not been too successful. Piezoelectric materials expand in an electric field if one polarity is applied to them and contract when that polarity is reversed. They produce very high forces but very small displacements. To increase the displacement, one approach is to stack small piezoelectric disks, each energized by its own voltage source, electrically in parallel but mechanically in series, known as stack motors. These motors do generate enough displacement to drive a fine wire with sufficient energy to make a dot impression, but their mass is too large to operate any faster than the equivalent magnetic armatures, and their cost can be much higher. Bilams are a common piezoelectric component made of two piezoelectric members laminated together, but they typically require large volume to generate the necessary energy for impact printing and this in turn requires high drive voltage, which is hazardous and is difficult to provide.

Speed, small size and compactness is sought in all of these designs with the purpose that if sufficient speed could be attained, two or more impacts could be made for each character, thus making it possible to compact the printer elements and to overlap individual dots in a staggered matrix array so that continuous lines rather than dotted lines could be used to print the characters and thereby improve the print quality. Or alternatively, the speed could be increased while the quality remains unchanged.

More recently, in the parent application cited above and incorporated herein by reference, a printer is disclosed which uses a multilam piezoelectric actuator which is tapered in shape to provide uniform stress distribution, proper weighting which increases energy transfer, typically by resonant response, and an electrical cocking preliminary to actuation which increases the energy output to the print elements. While this approach provides an excellent, high-quality printer, it does require the extra mass used for weighting and the circuit to provide the cocking action preliminary to each firing.

SUMMARY OF INVENTION

It is therefore an object of this invention to provide an improved more simplified, highly compact, energy-efficient, high-speed piezoelectric printer.

It is a further object of this invention to provide such a printer which is lower cost and operates on low voltage.

It is a further object of this invention to provide such a printer which can tightly compact the actuator units for enabling close overlapping, or staggered arrangements of the printing elements.

It is a further object of this invention to provide such a printer which can provide increased quality dot matrix printing.

It is a further object of this invention to provide an improved simplified, small, energy-efficient, high-speed piezoelectric actuator.

It is a further object of this invention to provide such an actuator which has longer life and provides greater deflection.

It is a further object of this invention to provide such an actuator which develops sufficient force and displacement to drive effectively a printer wire or element.

It is a further object of this invention to provide such an actuator which provides more uniform response.

It is a further object of this invention to provide such an actuator which uses an asymmetric piezoelectric bender of one or more layers.

It is a further object of this invention to provide such an actuator which uses external metal reinforcing layers.

It is a further object of this invention to provide such an actuator which is directly fired or actuated to drive a printing element.

It is a further object of this invention to provide such an actuator which can be combined with a printer element to form a printer unit that can be used in groups to make a dot matrix printer.

The invention results from the realization that a truly efficient, lower-cost, small, high-speed printer can be effected using an asymmetric piezoelectric bender driven in one direction only and that bender operation is enhanced by a tapered shape, which improves uniformity of stress distribution, and by the use of external metal reinforcing layers that improve life and increase available deflection limits.

This invention features a piezoelectric printer including a frame and a plurality of printer units mounted on the frame. Each unit includes an asymmetric piezoelectric bender including at least one piezoelectric member and having a mounting portion and an actuating portion. The actuating portion is moveable in an actuating direction and the bender is tapered in its lateral dimension so that it is larger at the mounting portion and smaller at the actuating portion. There are also provided first and second metal reinforcing layers externally mounted on the bender, the first on the side of the actuating direction, the second on the opposite side. Each printer unit includes a printing element driven by the actuating portion. There are means for applying an actuating voltage to the members in the poling direction for actuating the bender to drive the printing element to the printing means. Guide means attached to the frame guide the movement of the printing elements.

In a preferred embodiment, the printer units in a printer are arranged in sets of stacked arrays, each set including at least two printer units. The printer units may be staggered or overlapped, longitudinally or laterally, and in some cases inferior printer units may include one or more holes for receiving the printer elements of one or more superior printer elements. The piezoelectric members may be all formed from a single piezoelectric component.

The invention also features a piezoelectric printer unit used in such a printer and including an asymmetric piezoelectric bender including at least one piezoelectric member and having a mounting portion and an actuating portion. The actuating portion is moveable in an actuating direction and the bender is tapered in its lateral dimension so as to be larger at the mounting portion and smaller at the actuating portion. There are also provided first and second metal reinforcing layers externally mounted on the bender, the first on the side of the actuating direction, the second on the opposite side. A printer element is driven by the actuating portion, and there are means for applying an actuating voltage to the members in the poling direction for actuating the bender to drive the printing element in the printing direction to the printing position.

The invention also features a basic asymmetric piezoelectric actuator which forms the printer unit. The actuator includes a piezoelectric bender including at least one piezoelectric member having a mounting portion and an actuating portion. The actuating portion is moveable in an actuating direction and the multilam is tapered in its lateral dimension to be larger at the mounting portion and smaller at the actuating portion. There are also provided first and second metal reinforcing layers externally mounted on the bender, the first on the side of the actuating direction, the second on the opposite side. There are means for applying an actuating voltage to the members in the poling direction for cocking the bender. The bender may be generally trapezoidal in shape.

DISCLOSURE OF PREFERRED EMBODIMENT

Other objects, features and advantages will occur from the following description of a preferred embodiment and the accompanying drawings, in which.

Figure 1:
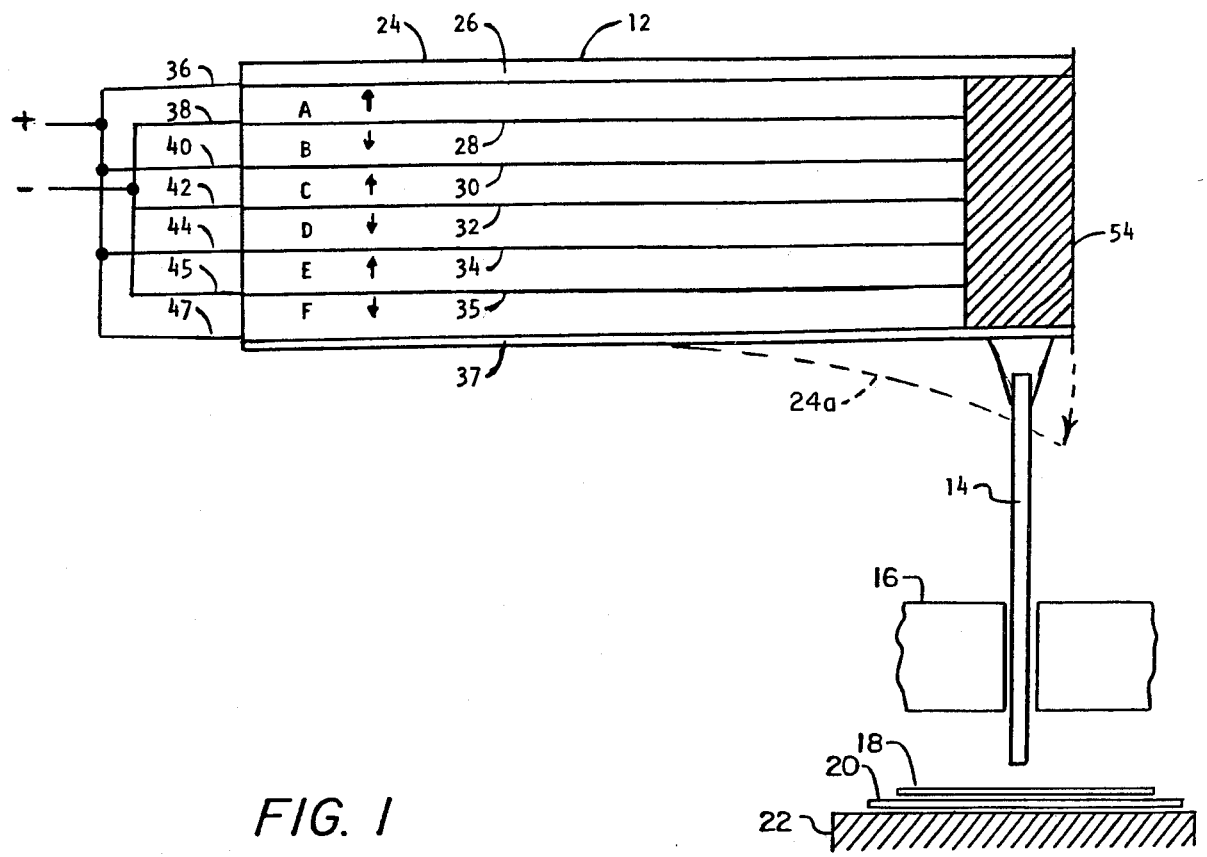
FIG. 1 is a schematic side elevational view of a printer unit using the piezoelectric actuator according to this invention.

The printer of this invention may be accomplished using a frame and a plurality of printer units mounted on the frame. Each of the units includes an asymmetric piezoelectric bender, two or more piezoelectric members, and has a mounting portion and an actuating portion. The bender is also known as a bilam when it contains two piezoelectric layers and as a multilam when it uses two or more piezoelectric layers. The actuating portion is moveable in an actuating direction and the bender is tapered in its lateral dimension to be larger at the mounting portion and smaller at the actuating portion. The taper may actually be trapezoidal in shape. There are also provided first and second metal reinforcing layers externally mounted on the bender, the first on the side of the actuating direction, the second on the opposite side. There are means for applying an actuating voltage to the members in the poling direction, for actuating the multilam to drive the printing element.

In developing printers according to the parent application, it was found that a very considerable reduction in cost could be achieved with little sacrifice in printing power by using asymmetric piezoelectric layers or members, arranged and polarized to bend in only one direction, namely in the direction toward the paper, when all of the layers are subjected to a voltage in their respective poling directions. This eliminates the cocking motion, and also the part of the electronic circuit required to deliver the cocking pulse to each layer. In many applications where multiple carbon copies are not required this simplification represents a significant economic improvement. The asymmetric benders according to this invention may have one or a plurality of layers, with their interposed electrodes connected in such a manner that all layers are energized simultaneously in their poling directions so that they will either expand or contract in unison. In a simple construction only one single metal layer is used, and it is located on one of the outer surfaces of the bender. The other electrodes are preferably metallized coatings with negligible mechanical strength.

In working with benders for the printers, it was found that, contrary to what one would expect, benders perform better in regard to maximum deflection and lifetime if metal layers are used not merely as the central plane (the neutral bending axis), but also as the outermost layers. The outermost surface of benders is customarily a coating of silver or other metal applied to the ceramic by a plating technique. The use of metal layers or shimstock as the outermost layer is avoided because it is expected to inhibit bending. Evidently, however, the increased stiffness is more than offset by the reinforcing effect in the tensile direction, at least when the lifetime of the ceramic is taken into account, and improved performance results. The mechanism by which this occurs is not yet understood.

The printer units are arranged in sets of stacked arrays, with each set including at least two units. In one construction, the units are staggered or disposed in an overlapping relationship, either longitudinally or laterally, in order to further increase the density of the printing elements and of the dot matrix produced. This is possible because the construction of the piezoelectric printer units and the underlying piezoelectric actuator is such that high-speed, high-energy printing can be effected by a very compact arrangement of the printer units without excessive heating problems. Inferior printer units may include one or more holes for receiving the printer elements of one or more superior printer units.

There is shown in FIG. 1 piezoelectric printer unit 10 according to this invention which includes piezoelectric actuator 12, printing element or wire 14, and guide block 16 which guides printing element or wire 14 as it moves to enable it to strike ribbon 18 at the proper location over paper 20 aligned against platen 22. Asymmetric piezoelectric actuator 12 includes a piezoelectric bender or multilam 24 having six piezoelectric members or layers A, B, C, D, E, and F with interstitial sections or coatings 28, 30, 32, 34, and 35 in the conventional multilam construction. A multilam as used herein is a piezoelectric device constructed as a bilam and having at least two layers. Piezoelectric bilams are also known as benders or bimorphs and are more fully explained in Glenite Piezoceramics, by Gulton Industries, Inc. Piezoelectric layers A–F may be made of piezoelectric materials such as barium titanate or lead titanate-lead zirconate. Metallized electrodes or coatings 28, 30, 32, 34 and 35 may be made of any metal or other conductive deposit, and may function as electrodes 38, 40, 42, 44, and 45, i.e. means to apply voltage directly across layers A, B, C, D, E, and F. Metal layers 37 and 26 may be formed of one mil brass and ten mil steel and function as electrodes 36 and 47, all respectively. Layers A–F may be each ten mils in thickness. The ceramic layers are poled and energized so as to expand in thickness and contract in length, causing the bender to deflect in the direction toward the brass, thus putting the brass into compression. This bender can be made to deflect further without cracking than one made without the brass shimstock facing, contrary to expectations. Mounting portion 50 of multilam 24 is the part that is fixed to the frame portions of the printer unit, while actuating portion 52 is free to move to drive printing element or wire 14.

A weight is added to multilam 24 to increase its ability to transfer energy during the actuating stroke. The weight is empirically determined by adding weight to multilam 24 until the maximum energy transfer is observed. That weight is applied distributively over the entire multilam, or at least the actuating portion 52 of it, or it may be concentrated as depicted by weight 54 at the end of the actuating portion. In that instance, print wire 14 may be attached directly to multilam 24 or may be separate and independent of multilam 24. Wire 14 may be any typical wire or element used in conventional dot matrix printers. The addition of weight 54 in whatever form increases the kinetic energy transfer during the actuating motion of multilam 24.

Figure 2:
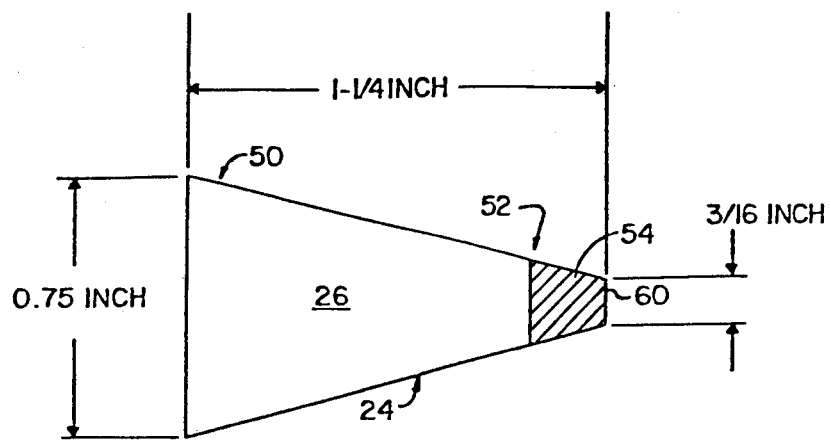
FIG. 2 is a diagrammatic plan view of the actuator of FIG. 1.

Multilam 24 may have a tapered shape in its lateral dimension such as shown in FIG. 2, where the trapezoidal shape is ¾ inch in the lateral dimension at the fixed end or mounting portion 50, and approximately 3/16 inch at the tip 60. Multilam 24 is approximately 1¼ inches long. This tapered shape improves the uniformity of stress distribution of multilam 24 and thereby causes all sections of multilam 24 to store and release energy uniformly in the piezoelectric material. Thus in the cantilevered configuration of FIG. 1, the broadest lateral portion is at the fixed end or mounting portion 50, where maximum bending stress will occur, while the narrowest lateral dimension is at tip 60, where the least amount of bending stress will occur. In such a device, over 90% of the energy is recovered and over 1000 dots per second may be printed.

In a simple application, multilam 24 is driven from its neutral position, as shown in full lines in FIG. 1, to its actuated position as shown in dashed lines 24a by the application of the proper voltage to layers A–F by means of electrodes 36–47. The manner in which the six-layer multilam 24 in FIG. 1 is energized is as follows. Arrows on each layer A–F indicate the direction of poling. A voltage applied in the direction of poling, arrowhead positive, causes the layers to expand in thickness and contract in length, causing the bender to deflect in the printing direction toward the brass layer 37 and place brass layer 26 in compression. Voltage applied in the poling direction may be as high as is permitted by the limit of mechanical rupture.

Figure 3:
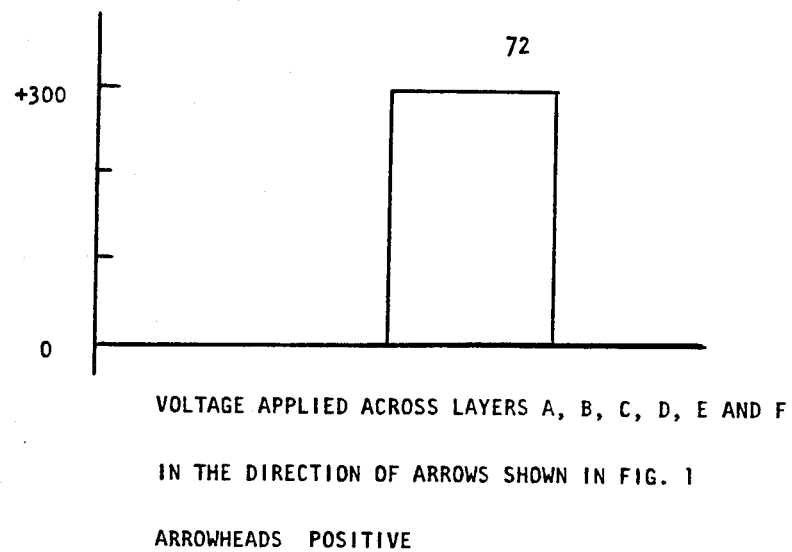
FIG. 3 illustrates the voltage wave form applied during the printing cycle to the actuator of FIG. 1.
Figure 4:
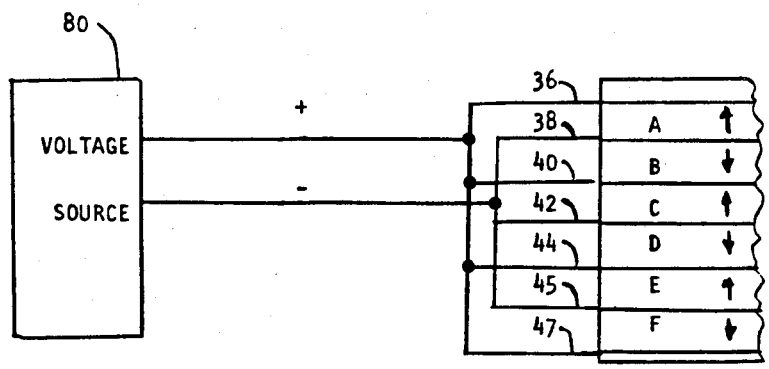
FIG. 4 is a means for generating and applying the voltage wave forms of FIG. 3.

The means for applying voltage pulses shown in FIG. 3 may include a voltage source 80, FIG. 4, which supplies +300 volts to layers A, B, C, D, E, and F.

Figure 5:
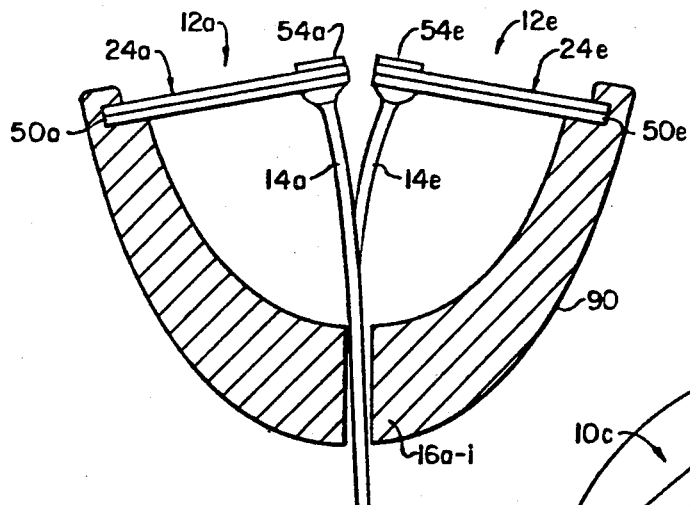
FIG. 5 is a schematic side elevational view of a printer taken along line 5—5 of FIG. 6.
Figure 6:
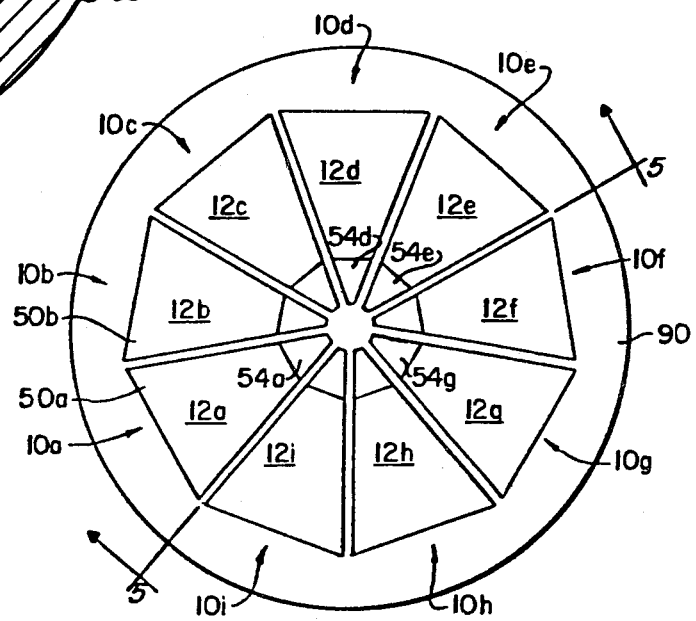
FIG. 6 is a top plan view of the printer of FIG. 5.

One or more printer units 10 may be utilized in a printer for driving a multiple of printing wires. For example, as shown in FIGS. 5 and 6, nine printing units 10a–10i are mounted on frame 90, which integrally includes guide blocks 16a–i for receiving wires 14a–i, that are aligned in a straight line by integral quide blocks 16a–i which receive wires 14a–i.

Figure 7:
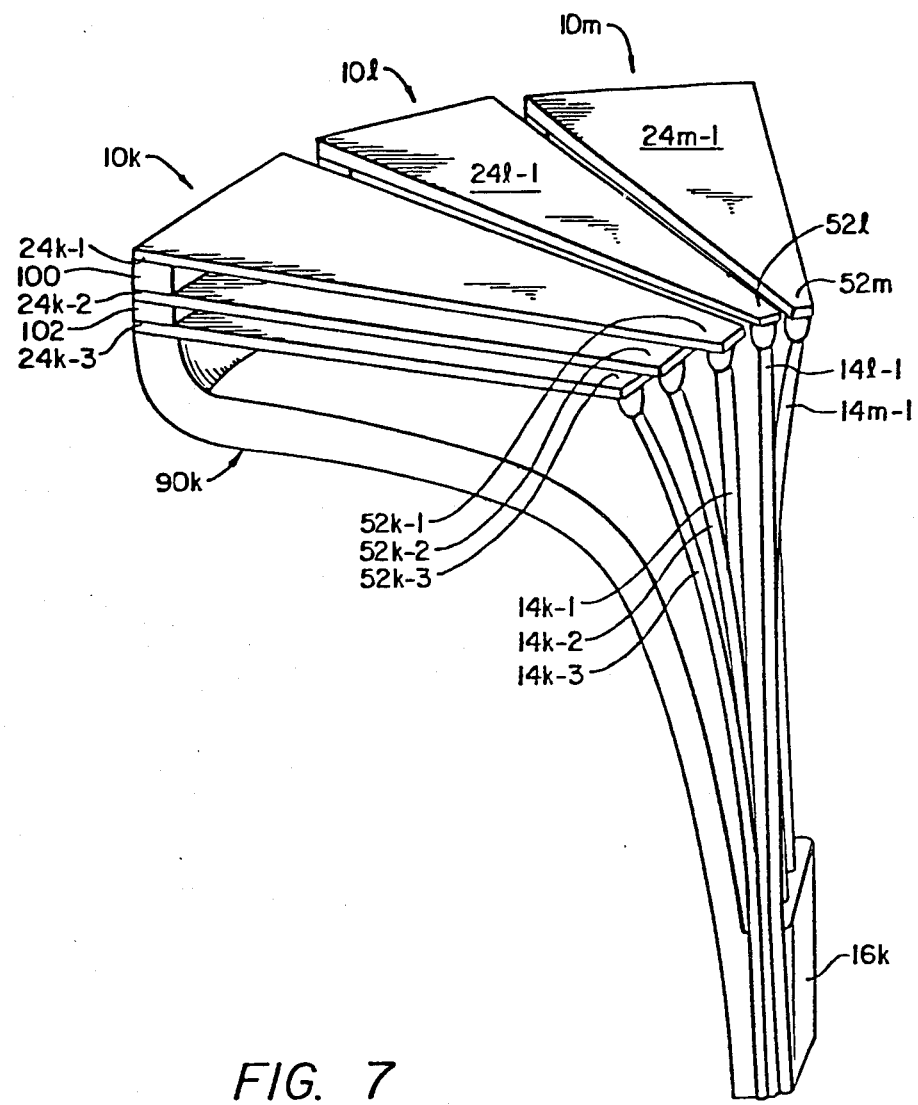
FIG. 7 is an axonometric view of a portion of a printer according to this invention including a plurality of printer units stacked one on top of the other with their actuator portions overlapping.
Figure 8:
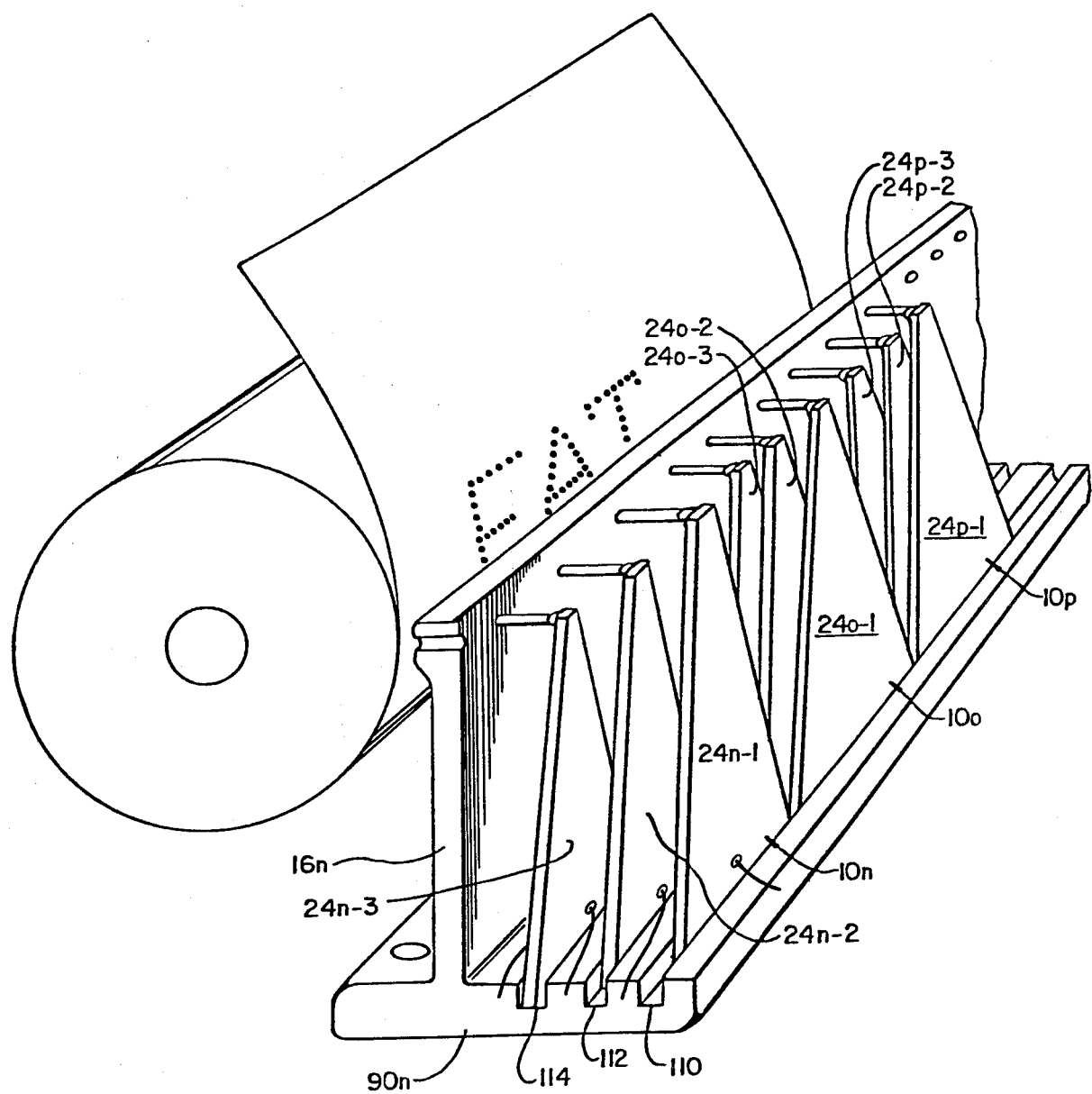
FIG. 8 is an axonometric view of a portion of a printer according to this invention having a plurality of sets of printer units in which the printer units in each set are overlapped laterally with respect to each other.

The printer units need not be used singly, but may be used in groups or sets of two or more as shown in FIG. 7, where there is shown a portion of a circular printer including a frame 90k that carries a number of printer units, only three shown, 10k, 10l, 10m, each of which includes a plurality of benders such as 24k-1, 24k-2, 24k-3, in a stacked array spaced by blocks 100, 102. Bender 24k may be arranged in an overlapping fashion so that the actuating portion 52k-1 overlaps actuating portion 52k-2, which in turn overlaps the actuating portion 52k-3, so that their respective printing elements or wires 14k-1, 14k-2, 14k-3 do not interfere with each other as they move in the holes in quide block 16k, which also acts to engage the wire elements 14l and 14m. Only one of each, 14i-1, 14m-1, is shown for clarity. Units 10l and 10m are formed in a similar way. The benders in a printer unit may also be staggered laterally, for example as shown in FIG. 8, where frame 90n includes slots 110, 112, and 114 for holding one each of the benders 24n-1, 24n-2, and 24n-3 of printer unit 10n, which benders are staggered laterally so that bender 24n-2 overlaps to the right of bender 24n-3, and 24n-1 overlaps to the right of bender 24n-2. Similar construction adheres with respect to printer unit 10o with respect to its bender units 24o-1, 24o-2, and 24o-3, as well as benders 24p-1, 24p-2, and 24p-3 of printer unit 10p.

Figure 9:
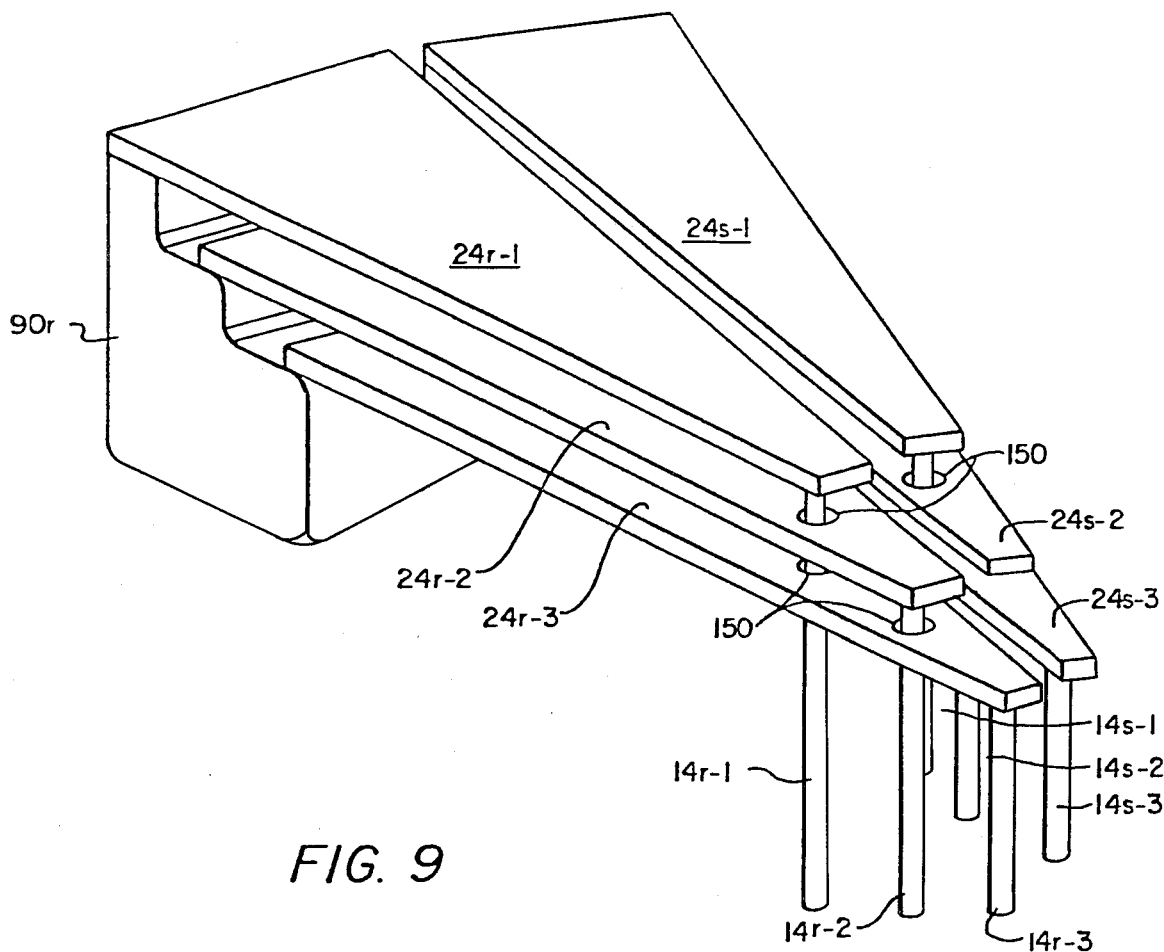
FIG. 9 is an axonometric view of a portion of a printer according to this invention having a plurality of sets of printer units in which the printer units in each set are overlapped and the inferior benders have holes for receiving the printer elements of the superior benders.

In FIG. 9 there is illustrated an embodiment in which each inferior bender 24r-3, 24s-3, 24r-2, 24s-2, has one or more holes 150 to accommodate passage of elements 14r-1, 14r-2, 14s-1, 14s-2 of each superior bender 24r-1, 24r-2, 24s-1, 24s-2, respectively. Each of the benders has its mounting portion attached to frame 90k.

The configurations shown in FIGS. 7-9 are illustrative only and are for the purpose of showing some convenient and compact ways that the printer of this invention can be made to facilitate high-density, high-quality, high-speed printing.

Figure 10:
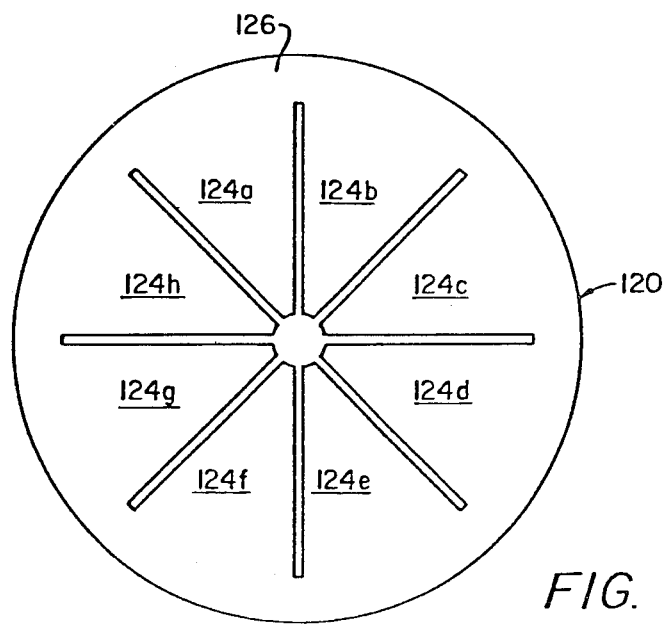
FIG. 10 is a plan view of a number of benders formed in a single piezoelectric component.

Although thus far the benders are shown as individually formed elements, this is not a necessary limitation of the invention, for they may be formed as integral units, for example as shown in FIG. 10, where a single piezoelectric component 120 is divided into eight benders 124a, 124b, 124c, 124d, 124e, 124f, 124g, and 124h, which are all segments of the same plate and are connected at the outer annular periphery 126.

Other embodiments will occur to those skilled in the art and are within the following claims:

What is claimed is:

1. A piezoelectric printer comprising:
a frame;
a plurality of printer units mounted on said frame; each unit including:
an asymmetric piezoelectric bender including one or more piezoelectric members and having a mounting portion and an actuating portion moveable in an actuating direction; said bender being tapered in its lateral dimension, being larger at the mounting portion and smaller at the actuating portion; and a printing element driven by said actuating portion;
means for applying an actuating voltage to both of said members in the poling direction for actuating said bender to drive said printing element to the printing position; and
guide means attached to said frame for guiding said printing elements.

2. The printer of claim 1 in which said said piezoelectric benders of printer units are arranged in sets of stacked arrays, each set including at least two said units.

3. The printer of claim 2 in which said said piezoelectric benders of printer units are staggered in said sets of stacked arrays, each set including at least two said units.

4. The printer of claim 2 in which said said piezoelectric benders of printer units in each set are disposed in overlapping relationship.

5. The printer of claim 4 in which said printer units overlap longitudinally at said actuating portion.

6. The printer of claim 2 in which said said piezoelectric benders of printer units overlap laterally.

7. The printer of claim 2 in which said piezoelectric members are all formed from a single piezoelectric component.

8. The printer of claim 7 in which said piezoelectric component is circular.

9. The printer of claim 4 in which each of the inferior printer units includes one or more holes for receiving the printer element of one or more superior printer units.

10. The printer of claim 1 in which said bender includes a plurality of piezoelectric members.

11. The printer of claim 1 further including first and second metal reinforcing layers externally mounted on said bender, the first on the side of the actuating direction, the second on the opposite side.

12. A piezoelectric printer comprising:
a frame;
a plurality of printer units mounted on said frame; each unit including:
an asymmetric piezoelectric bender including one or more piezoelectric members and having a mounting portion and an actuating portion moveable in an actuating direction; said bender being tapered in its lateral dimension, being larger at the mounting portion and smaller at the actuating portion; and a printing element driven by said actuating portion;
first and second metal reinforcing layers externally mounted on said bender, the first on the side of the actuating direction, the second on the opposite side;
means for applying an actuating voltage to both of said members in the poling direction for actuating said bender to drive said printing element to the printing position; and
guide means attached to said frame for guiding said printing elements.

13. A piezoelectric printer comprising:
a frame;
a plurality of printer units mounted on said frame, each unit including: an asymmetric bender including one or more piezoelectric members and having a mounting portion and an actuating portion; said actuating portion being movable in an actuating direction; said bender being tapered in its lateral dimension, being larger at the mounting portion and smaller at the actuating portion; a printing element driven by said actuating portion;
means for applying an actuating voltage to both of said members in the poling direction for actuating said bender to drive said printing element in the printing direction.

14. A piezoelectric printer comprising:
a frame;
a plurality of printer units mounted on said frame, each unit including: an asymmetric bender including one or more piezoelectric members and having a mounting portion and an actuating portion; said actuating portion being movable in an actuating direction; said bender being tapered in its lateral dimension, being larger at the mounting portion and smaller at the actuating portion; a printing element driven by said actuating portion;
first and second metal reinforcing layers externally mounted on said bender, the first on the side of the actuating direction, the second on the opposite side; and means for applying an actuating voltage to both of said members in the poling direction for actuating said bender to drive said printing element in the printing direction.

15. A piezoelectric printer unit comprising:
an asymmetric piezoelectric bender including one or more piezoelectric members and having a mounting portion and an actuating portion; said actuating portion being moveble in an actuating direction; said bender being tapered in its lateral dimension, being larger at the mounting portion and smaller at the actuating portion;
a printing element driven by said actuating portion; and
means for applying an actuating voltage to both of said members in the poling direction for actuating said bender to drive said printing element in the printing direction to the printing position.

16. The piezoelectric printer unit of claim 15 further including means for guiding said printing element.

17. The piezoelectric printer unit of claim 15 in which said multilam is generally trapezoidal in shape.

18. The piezoelectric printer unit of claim 15 in which said printing element is fixed to said actuating portion.

19. The piezoelectric printer unit of claim 15 in which said bender includes a plurality of piezoelectric members.

20. A piezoelectric printer unit comprising:
an asymmetric piezoelectric bender including one or more piezoelectric members and having a mounting portion and an actuating portion; said actuating portion being moveble in an actuating direction; said bender being tapered in its lateral dimension, being larger at the mounting portion and smaller at the actuating portion;
first and second metal reinforcing layers externally mounted on said bender, the first on the side of the actuating direction, the second on the opposite side;
a printing element driven by said actuating portion; and
means for applying an actuating voltage to both of said members in the poling direction for actuating said bender to drive said printing element in the printing direction to the printing position.

21. A piezoelectric actuator comprising:
an asymmetric piezoelectric bender including one or more piezoelectric members and having a mounting portion and an actuating portion; said actuating portion being moveable in an actuating direction; said bender being tapered in its lateral dimension, being larger at the mounting portion and smaller at the actuating portion; and
means for applying an actuating voltage to said bender in the poling direction for actuating said bender.

22. The piezoelectric actuator of claim 21 in which said bender is generally trapezoidal in shape.

23. The piezoelectric actuator of claim 21 further including first and second metal reinforcing layers externally mounted on said bender, the first on the side of the actuating direction, the second on the opposite side.

24. The piezoelectric actuator of claim 21 in which said means for applying a voltage includes electrodes attached to said bender.

25. The piezoelectric actuator of claim 22 in which said bender includes a plurality of piezoelectric members.

26. A piezoelectric actuator comprising:
an asymmetric piezoelectric bender including one or more piezoelectric members and having a mounting portion and an actuating portion; said actuating portion being moveable in an actuating direction; said bender being tapered in its lateral dimension, being larger at the mounting portion and smaller at the actuating portion;
first and second metal reinforcing layers externally mounted on said bender, the first on the side of the actuating direction, the second on the opposite side; and
means for applying an actuating voltage to said bender in the poling direction for actuating said bender.

* * * * *